(12) United States Patent
Kosmala

(10) Patent No.: US 6,837,747 B1
(45) Date of Patent: Jan. 4, 2005

(54) FILTERED CONNECTOR

(75) Inventor: Michael Lawrence Kosmala, Mission Viejo, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 10/827,891

(22) Filed: Apr. 19, 2004

(51) Int. Cl.⁷ .............................................. H01R 13/66
(52) U.S. Cl. ...................................................... 439/620
(58) Field of Search ........................ 439/79, 607, 620

(56) References Cited

U.S. PATENT DOCUMENTS

| | | | | |
|---|---|---|---|---|
| 4,784,618 | A | * 11/1988 | Sakamoto et al. | 439/620 |
| 4,995,834 | A | * 2/1991 | Hasegawa | 439/620 |
| 5,141,455 | A | 8/1992 | Ponn | 439/620 |
| 5,152,699 | A | 10/1992 | Pfeifer | 439/620 |
| 5,286,221 | A | 2/1994 | Fencl et al. | 439/607 |
| 5,290,191 | A | 3/1994 | Foreman et al. | 439/225 |
| 5,340,334 | A | * 8/1994 | Nguyen | 439/620 |
| 5,415,569 | A | 5/1995 | Colleran et al. | 439/620 |
| 5,456,616 | A | 10/1995 | Fuerst et al. | 439/620 |
| 5,521,784 | A | 5/1996 | Libregts | 361/328 |
| 5,554,050 | A | 9/1996 | Marpoe, Jr. | 439/620 |
| 5,599,208 | A | 2/1997 | Ward | 439/620 |
| 5,605,477 | A | 2/1997 | Wu et al. | 439/620 |
| 5,639,264 | A | 6/1997 | Belopolsky et al. | 439/620 |
| 6,086,422 | A | 7/2000 | Glynn | 439/620 |
| 6,159,049 | A | 12/2000 | Schramme et al. | 439/620 |
| 6,467,165 | B1 | 10/2002 | Glynn | 29/876 |
| 6,652,292 | B2 | 11/2003 | Pratt et al. | 439/76.1 |

* cited by examiner

*Primary Examiner*—Thanh-Tam Le
(74) *Attorney, Agent, or Firm*—Roger C. Turner

(57) ABSTRACT

A standard D-sub connector is modified to connect a capacitor (64) between each of many contacts (14) and the grounded metal shell (16), in a construction of minimum parts. A flexible circuit (62) is provided with numerous metal-plated ground holes and signal holes, each ground hole connected to a capacitor terminal (142) and to a common ground plane (150), and each signal hole connected to a capacitor terminal (140) and to a contact (14). The flexible circuit has edge portions (81–84) that are bent to locate outer edge parts (152) of the ground plane against a flange (42) of the connector metal shell to which the ground plane is connected as by a solder joint (154).

8 Claims, 3 Drawing Sheets

FILTERED CONNECTOR

BACKGROUND OF THE INVENTION

It is often desirable to connect circuit components to connector contacts to provide filtering, as to block high frequency noise. Capacitors are the most common type of circuit component that is used for this purpose. Each capacitor must have one terminal connected to the contact and another terminal connected to ground potential, usually though a metal shell of the connector which is grounded. One approach is to use a one-piece ceramic connector array, which is costly and nondurable. Another approach is to mount a circuit board on the connector, with holes drilled in the board and capacitors mounted on the board, and to connect a grounding trace on the board to the connector shell. In most cases, it is necessary to provide separate leads to connect the grounding trace to the connector shell, which increases the cost and reduces the reliability of the connections. A construction which mounts and connects components to the connector shell using a minimum number of parts, would be of value.

SUMMARY OF THE INVENTION

In accordance with one embodiment of the present invention, a connector is provided with circuit components such as miniature capacitors that each have one terminal electrically connected to a connector contact and another terminal electrically connected to the connector shell, using a minimum number of parts for low cost and high reliability. The circuit components are mounted on a primarily flat main portion of a flexible circuit, or flex circuit. Another portion of the flex circuit, such as an edge portion, is bent to extend to a location on the shell where a ground trace of the flex circuit is joined to the shell as though a solder joint.

The flex circuit is provided with a plurality of ground holes that are each metal plated and connected to a common ground plane at a second side of the flex circuit. The flex circuit is also provided with a plurality of signal holes that are each metal plated but isolated from one another, and with each contact to be filtered extending through one of the signal holes. Each capacitor has one terminal soldered to the trace of a ground hole, and has another terminal soldered to a trace of a signal hole in a solder joint that also joins to the contact passing through the hole.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
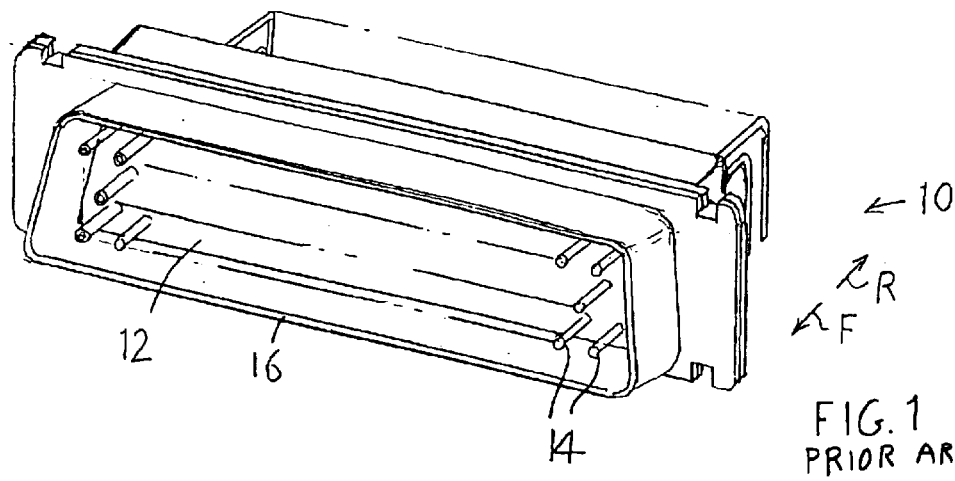
FIG. 1 is a front isometric view of a prior art D-sub connector.
Figure 2:
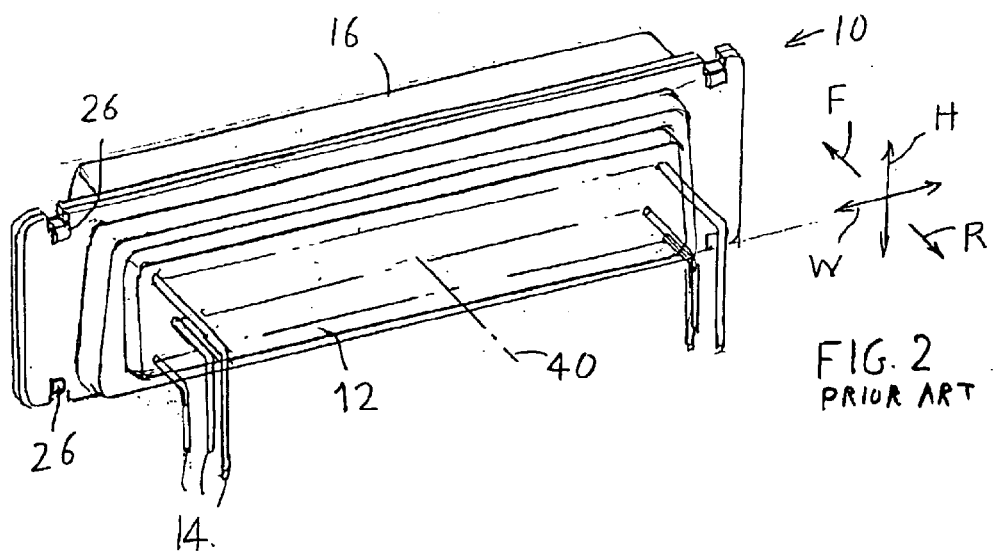
FIG. 2 is a rear isometric view of the prior art connector of FIG. 1.
Figure 3:
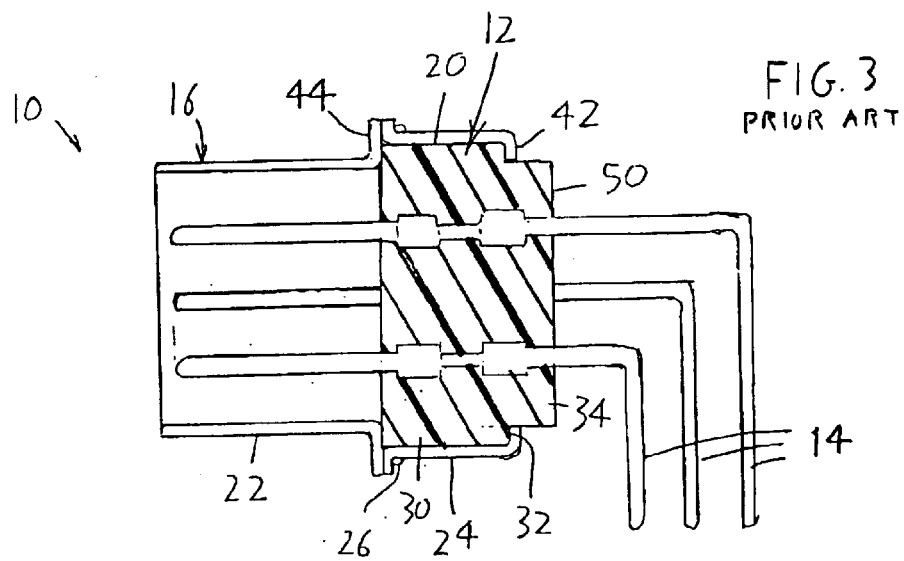
FIG. 3 is a sectional view of the prior art connector of FIG. 1.

FIGS. 1–3 shows a prior art D-sub connector 10 which includes an insulator 12, a plurality of contacts 14 that extend in front F and rear R directions through the insulator, and a metal shell 16 that surrounds a side 20 of the insulator. The shell is formed by two sheet metal parts 22, 24 that are held together by tabs 26. The insulator is formed with a front insulator portion 30 having a rearwardly-facing shoulder 32, and with a rear insulator portion 34 of smaller width in direction W and height in direction H, than the width and height of the front insulator portion. The shell has an inward (with respect to the center axis 40), or internal flange 42 that abuts the insulator rearwardly-facing shoulder 32 to trap the insulator against a shell flange 44.

There is sometimes a need to connect miniature circuit components to all or selected ones of the contacts. A circuit component is a device that affects ac currents, and is usually a capacitor, inductor, or resistor, with a capacitor being the most common. It would be possible to mount a typical circuit board that includes a rigid insulative board with conductive traces, at the rear 50 of the insulator; also, one could mount capacitors on the circuit board, connect one terminal of each capacitor to a contact and connect the other terminal of each capacitor to the shell, as though a ground plane on a circuit board face. However connection to the connector shell 16 can involve additional parts that add to the complexity and cost and which reduce reliability. This is especially true because no part of the shell 16 of a standard D-sub connector 10 lies flush with or slightly rearward of the rear surface 50 at the insulator.

Figure 4:
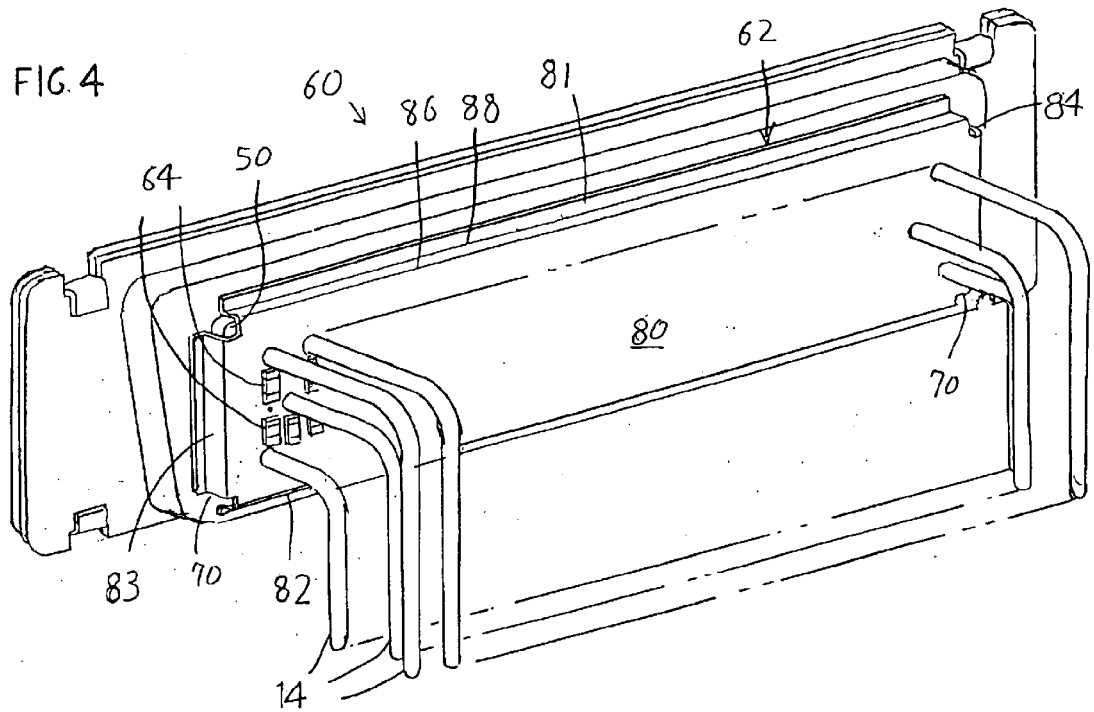
FIG. 4 is a rear isometric view of a connector similar to that of FIG. 1, but modified in accordance with the present invention.
Figure 5:
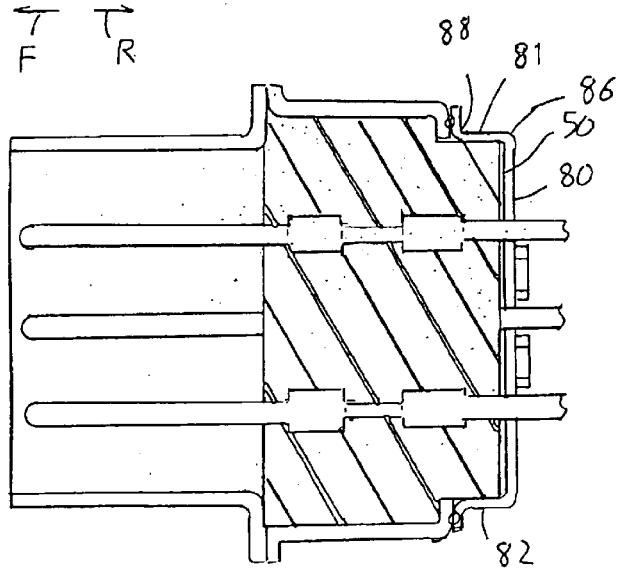
FIG. 5 is a sectional view of the connector of FIG. 4.

In accordance with the present invention, applicant provides a connector of the construction shown at 60 in FIG. 4, which includes a flex circuit 62 and capacitors 64 mounted on the flex circuit. The flex circuit is initially of a largely rectangular shape, with corner cutouts 70. As also shown in FIG. 5, the flex circuit has a substantially flat, or planar, main portion 80 that lies rearward and preferably adjacent to the rear 50 of the insulator. The flex circuit has edge regions 81–84 that are bent out of the plane of the main portion 80, each edge portion having a pair of bends 86, 88.

Figure 6:
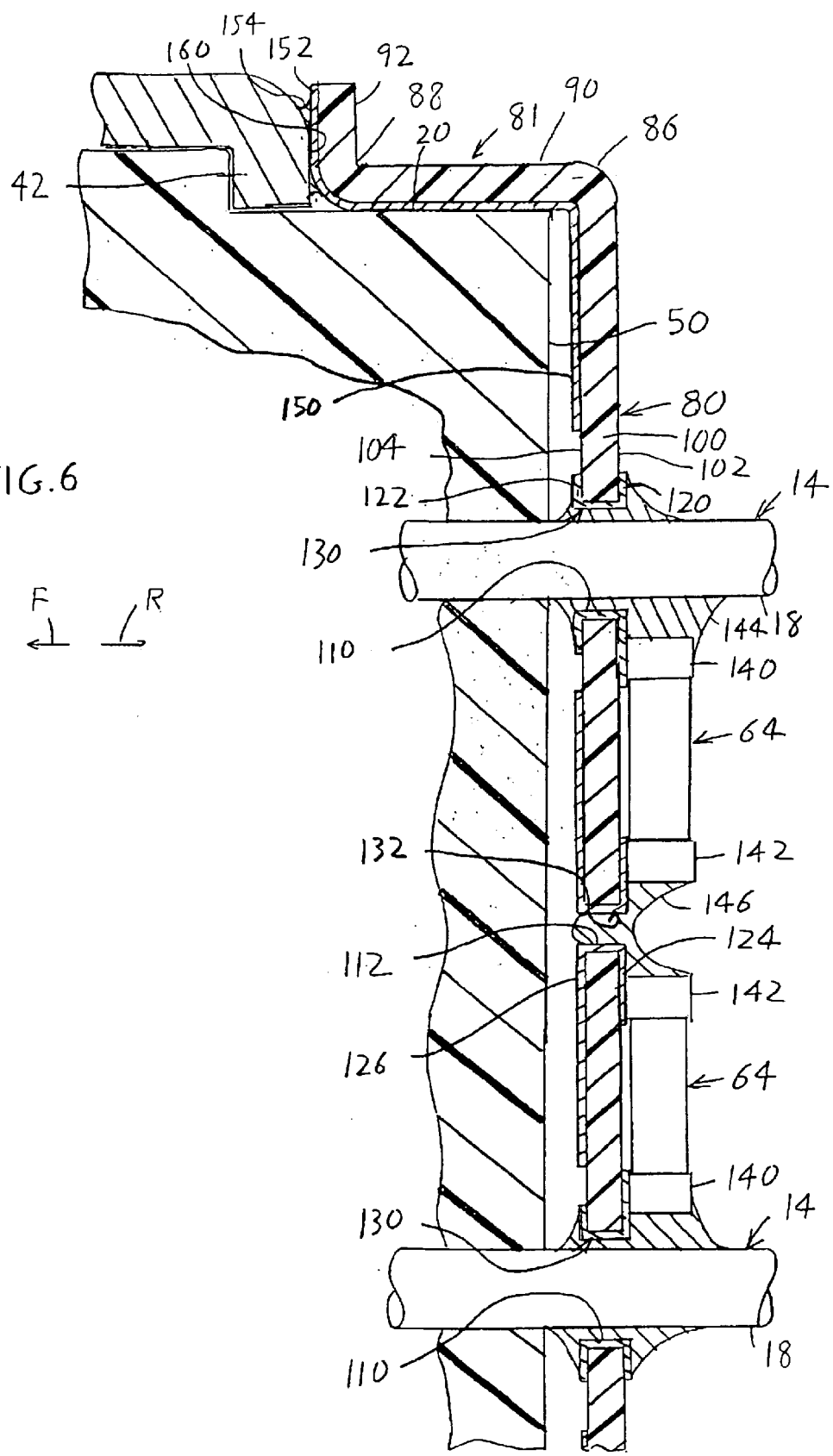
FIG. 6 is an enlarged view of a portion of the connector of FIG. 5.

As shown in FIG. 6, the bends 86, 88 in each edge region such as 81 of the flex circuit, form an inner part 90 of the edge region that extends forwardly F and adjacent to a side 20 of the insulator, and form an outer part 92 of the edge region that extends largely parallel to the shell inner flange 42. The flex circuit 62 has traces that are connected to capacitor terminals, to contacts, and to the connector shell. The flex circuit includes a sheet 100 of flexible insulative material. Electrically conductive traces are attached to first and second faces 102, 104 of the insulative sheet. The insulative sheet has multiple metal plated signal holes 110 and metal plated ground holes 112 that are each plated with conductive material which is almost always metal. The plating on each hole is normally integral with conductive traces on the circuit board faces. That is, the signal plated holes 110 are integral with signal traces 120, 122 on the opposite faces of the insulative sheet, and the ground plated holes 112 are integral with ground traces 124, 126 on opposite faces of the insulative sheet. The plated holes and any conductive traces portions on the flex circuit sheet immediately (e.g. within one millimeter of the hole) around the hole may be referred to as signal and ground hole connections 130, 132.

Rear ends 18 of the connector contacts 14 that are to be connected to a capacitor, each extends though one of the signal hole connections 130. Each capacitor 64 has signal and ground terminals 140, 142. Each signal terminal 140 is connected to one of the signal hole connections 130, and each ground terminal 142 is connected to one of the ground hole connections 132. The electrical connections are made though signal and ground solder joints 144, 146. Each signal solder joint 144 includes a quantity of solder that joins a capacitor signal terminal 140 to a signal hole connection 130 and to a contact rear portion 18. Each ground solder joint 146 joins a capacitor ground terminal 142 to a ground hole connection 132.

Each of the multiple ground hole connections includes a ground trace portion 126 on the flex circuit insulative sheet second face that is integral, or connected, to a ground plane 150 that covers much of the second face 104 of the flex circuit insulative sheet. The edge region 81 of the flex circuit is bent so an outer portion 152 of the ground plane lies adjacent to, and preferably primarily parallel or facewise adjacent to the rear surface 160 of the inner flange 42 of the connector shell. The edge region 81 of the flex circuit also includes the inner part 90 that extends largely forwardly from the main portion 80 of the flex circuit, in order to position the ground plane outer part 152 facewise adjacent to the shell flange. The ground plane outer portion 152 is electrically connected to the flange rear surface 160, preferably by a solder joint 154, although conductive paste or other means could make the connection.

The flexible sheet 100 of the flex circuit initially lies primarily flat, without any sharp bends (bends of a radius less than ten times the sheet thickness). The sheet is initially formed in a rectangular shape, but with the cutouts 70 in its four corners, to leave the four sides, or edge regions 81–84. The two bends 86, 88 in each edge region form the inner and outer edge parts. The edge regions overhang (extend beyond) sides of the insulator rear portion. The flex circuit is preferably bent so the bends tend to hold the shape to which they were bent, but this is not necessary. When the bent flex circuit is moved forwardly around the contacts (or the flex circuit is moved forwardly and its edge regions are bent) until its outer edge regions 81–84 lie against the connector shell flange, the four ground plane parts on the four outer edge parts are soldered to the shell. Such soldering is preferably performed by melting solder preforms that have been previously placed on the shell and/or the ground plane outer parts.

Applicant prefers to provide a single ground plane 150 that connects to all ground traces 126 and that extends to all four edge regions of the flex circuit. However, it is possible to have a plurality of ground planes that are not connected together at the flex circuit, but that are all at ground potential because each is connected to the shell.

Thus, the invention provides a connector of the type wherein the rear of the insulator may not be flush with the metal shell, but on which circuit components such as capacitors are mounted and electrically connected between contacts and the shell, which is of a simple, rugged and low cost design. A flexible circuit has a main portion that lies primarily in a plane that is parallel to the insulator rear, and has plated holes though which the contacts extend and to which component signal terminals are connected as though solder joints. The ground terminals of the components are connected to a ground trace on the flex circuit. One or more edge portions of the flex circuit are bent out of the plane of the main portion so as to position ground trace locations adjacent to the shell, and preferably facewise and adjacent to the shell, so the ground locations can be readily connected to the shell. In a D-sub connector, a rectangular flex circuit is provided with cutouts at its four corners, to leave four edge regions that each have two bends to leave inner and outer edge parts. The inner edge parts extend forwardly from the main flex circuit portion, while the outer edge parts each extend largely parallel to a plane of a shell flange to which the ground trace is soldered.

Although particular embodiments of the invention have been described and illustrated herein, it is recognized that modifications and variations may readily occur to those skilled in the art, and consequently, it is intended that the claims be interpreted to cover such modifications and equivalents.

What is claimed:

1. A connector of the type that includes a connector insulator with front and rear ends, a plurality of contacts extending through said connector insulator and having contact rear ends projecting from said connector insulator rear end, and a metal shell that extends around a side of said connector insulator, wherein the connector includes a plurality of circuit component with first and second component terminals that are connected between a first of said contacts and said metal shell, comprising:

a flexible circuit that comprises a sheet of bendable insulative material having first and second opposite sheet faces, a plurality of metal-plated signal holes in said sheet, and a ground trace on one of said sheet faces;

each of a plurality of said contact rear ends projects through one of said signal holes;

said first component terminals are each electrically connected, at a location of one of said signal holes, through a solder joint to the contact rear end that passes through the signal hole and to the metal-plated hole, and said second component terminals are each connected to said ground trace;

said flexible circuit is bent to locate a plurality of location on said ground trace against said metal shell, said plurality of locations being soldered to said metal shell.

2. The connector described in claim 1 wherein said connector insulator has sides and has a rear portion that projects rearward of said shell, said shell having a rear portion that extends around said connector insulator sides;

said flexible circuit has a primarily flat flex circuit main portion that lies behind said connector insulator rear end, and said flexible circuit has circuit edge regions with inner parts that are bent to extend toward said shell rear portion and with outer parts that are bent to place said ground trace facewise adjacent to said shell rear portion at said plurality of locations that are soldered to said metal shell.

3. The connector described in claim 1 wherein said connector insulator has sides and has a connector insulator rear portion that projects rearward of said shell, said connector insulator rear portion having a rectangular shape with four insulator corners as viewed from the rear;

said flexible circuit has a rectangular shape except for cut-outs at each of the four corners of the rectangular shape that leave four independent edge regions at the four sides of the rectangular shape, each edge region extending along a side of the connector insulator rear portion and along said shell, and each of said connector insulator corners being exposed by being free of being covered by the flexible circuit.

4. A connector of a type that has an insulator with front and rear insulator portions, a plurality of contacts that extend through said insulator and that have front and rear contact portions with at least the rear contact portion projecting from the insulator, and a metal shell that surrounds a side of the insulator, said insulator rear portion projecting rearward of the shell and having a rear face, wherein a plurality of capacitors are each connected between one of said contacts and said shell, including:

a flexible circuit that includes a sheet of flexible insulative material having first and second faces, a plurality of conductive traces on said faces including a plurality of signal traces isolated from each other and a plurality of ground trace regions that are all at the same electrical potential;

said plurality of capacitors each has one terminal connected to one of said signal traces and to one said contacts, and has another terminal connected to one of said ground trace regions;

said flexible circuit having a primarily flat main part lying primarily parallel to said insulator rear face, and said flexible circuit having an edge region that is bent to position a location on said edge region adjacent to said shell, with a portion of said ground trace on said location being electrically connected to the shell.

5. The connector described in claim 4 wherein said insulator has an insulator rearwardly facing shoulder at a front end of said insulator rear portion, and said shell has a rear end forming an internal flange that presses against said insulator rearwardly facing shoulder, and wherein:

said edge region of said flexible circuit has an inner side part that lies beyond a side of said insulator rear portion and that extends toward said shell internal flange, and said edge region has an outer side part that extends largely parallel to and against a rear surface of said shell internal flange.

6. The connector described in claim 5 wherein said insulator has front and rear portions that are each of parallelepiped shape, said insulator rear portion having a smaller width and length, in directions perpendicular to front and rear directions, than said insulator front portion, and said shell internal flange has width-spaced opposite sides and height-spaced top and bottom ends, that each lies against said rearwardly facing shoulder of said insulator, and wherein:

said flexible circuit has four edge portions including said edge region, each edge portion including an inner part that lies forward of and beyond said insulator rear portion and an outer part that lies facewise against said shell internal flange and is soldered thereto.

7. A method for modifying a connector to add circuit components to connector contacts, where the connector includes an insulator having front and rear insulator portions, where said insulator rear portion has a smaller width than said insulator front portion so said insulator front portion forms a rearwardly-facing shoulder, said connector includes a plurality of contacts that extend through said insulator and that have contact rear portions that project rearwardly from said insulator, and said connector includes a metal shell that has a rear internal shell flange that lies against said shoulder, said insulator rear portion projecting rearward of said shell flange, including:

forming holes in a flexible insulative sheet of a flexible circuit and applying conductive signal traces to said sheet in and around said holes, and applying a ground trace to said sheet;

projecting a plurality of said contact rear portions each through one of said holes;

placing said components over said flexible circuit, soldering a signal terminal of each component to one of said signal traces and to one of said contacts, and soldering a ground trace of each component to said ground trace;

bending the flexible circuit so at least one location on said ground trace lies adjacent to said shell, and soldering said location to said shell.

8. The method described in claim 7 wherein:

said step of bending includes bending a side of said flexible circuit that overhangs said insulator rear portion to bring the ground trace against said shell flange.

* * * * *